United States Patent [19]

Muray

[11] Patent Number: 5,246,800
[45] Date of Patent: Sep. 21, 1993

[54] DISCRETE PHASE SHIFT MASK WRITING

[75] Inventor: Andrew J. Muray, Fremont, Calif.

[73] Assignee: Etec Systems, Inc., Hayward, Calif.

[21] Appl. No.: 759,553

[22] Filed: Sep. 12, 1991

[51] Int. Cl.[5] .............................................. G03F 9/00
[52] U.S. Cl. ...................................... 430/5; 430/302; 430/320
[58] Field of Search ............................ 430/5, 302, 320

[56] References Cited

U.S. PATENT DOCUMENTS 4,902,899  2/1990  Lin .

FOREIGN PATENT DOCUMENTS

| | | |
|---|---|---|
| 0293643A3 | 5/1988 | European Pat. Off. ............... 7/20 |
| 0395425A3 | 4/1990 | European Pat. Off. ............... 1/14 |
| 0464492A1 | 6/1991 | European Pat. Off. ............... 1/14 |
| 61-292643 | 12/1986 | Japan . |
| 62-67514 | 3/1987 | Japan . |
| 2-78216 | 3/1990 | Japan . |

OTHER PUBLICATIONS

Nistler et al, "Issues associated with the commercialization of shift masks," *11th Ann. BACUS Symp. Photomask Tech.* (1991), SPIE vol. 1604, pp. 236–264.

"Phase-shift mask technology: requirements for e--beam mask lithography" by Steven K. Dunbrack et al., *Proceedings Reprint; SPIE-The International Society for Optical Engineering*, Mar. 4–5, 1991, pp. 314–326.

"Modeling Phase Shifting Masks" by Andrew R. Neureuther, *Preliminary version of BACUS Symposium Paper*, Sep. 26, 1990, pp. 1–6 and FIGS. 1–13.

"Binary and Phase-shifting Image Design for Optical Lithography" by Yong Liu et al., *SPIE Microlithography Symposium*, no date, pp. 1–18.

"Improving Resolution in Photolithography with a Phase-Shifting Mask" by Marc D. Levenson, et al., *IEEE Transactions on Electron Devices*, vol. Ed-29, No. 12, Dec. 1982, pp. 1828–1832, (p. 1833 missing), 1834–1836.

"Phase-Shifting and Other Challenges in Optical Mask Technology" by Burn J. Lin, *10th Bay Area Chrome Users Symposium*, Sep. 26, 1990, pp. 1–26.

"Fine Pattern Fabrication with Multistage Phase Shifter (1)—Simulation" by Y. Hirai et al., *Japanese Technical Translators Inc.*, no date, p. 5.

*Primary Examiner*—Marion E. McCamish
*Assistant Examiner*—Mark A. Chapman
*Attorney, Agent, or Firm*—Skjerven, Morrill, MacPherson, Franklin & Friel

[57] ABSTRACT

A method and apparatus for photolithographically fabricating features on a very large scale integrated circuit wafer by use of a phase shift mask defining discrete regions. This overcomes the problems of intensity nulls at the junction of regions formed by portions of the mask having opposite phase. The mask includes a transition region defining three phases which are assigned to pixels in the transition region, such that the phase assignment of the pixels is synthesized from an algorithm taking into account optical resolution and depth of focus. Each pixel is assigned one of three discrete phases, which thereby creates a transition region simulating a ramp between the two regions of opposite phases, such that intensity variation of the optical image corresponding to the transition region is minimized.

14 Claims, 10 Drawing Sheets

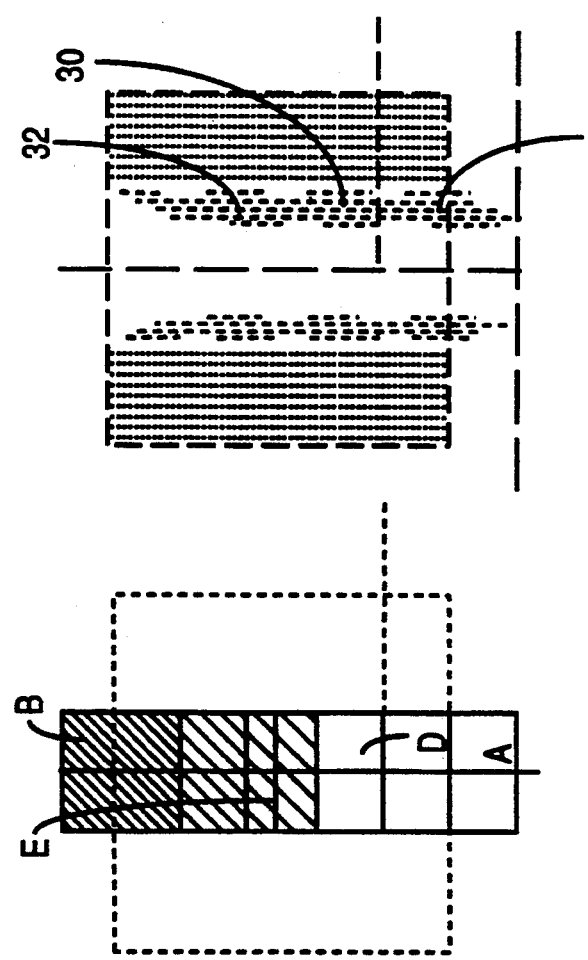

DISCRETE PHASE SHIFT MASK WRITING

BACKGROUND OF THE INVENTION

1. Field of the Invention

This invention relates to phase shift masks as used in photolithography for fabrication of very large scale integrated circuits. More specifically, this invention relates to a method for forming transition regions between adjacent phase shift mask regions which are of different phase to create a smooth transition between the two phases after optical exposure and hence a transition region in a feature of the integrated circuit with no artifacts due to phase shift intensity nulls.

2. Description of the Prior Art

Phase shifting mask technology for optical lithography is well known. If light from a coherent or partially coherent source is divided by a mask into two or more beams that are superimposed, the intensity in the region of super position varies from point to point between maxima, which exceed the sum of the intensities in the beam, and minima, which may be zero. This phenomenon is called interference. Phase shifting can influence the location and intensity of the interference maxima and minima by adjustment of pattern design and deliberate phase change of the light beams. This results in imaging of higher spatial frequency objects, enhancement of edge contrast, larger exposure latitude, and/or improved depth of focus. Phase shifting is typically accomplished by introducing an extra patterned layer (or layers) of transmissive material on the mask. It is alternatively implemented by etching the mask substrate to various thicknesses so as to effectively provide at least one extra layer. As light propagates through the substrate and through the extra layer, the wave length of the light is reduced from that in the ambient air by the refractive indices of the substrate and the extra layer, respectively.

The optical path difference between the two beams through the extra material layer and without it, is $(n-1)a$ where n is the refractive index of the extra layer and a is the thickness of the extra layer. The phase difference is then proportional to the optical path difference divided by the wave length (in vacuum) of the transmitted light. Usually a phase shift of $\pi$ (180°) is desirable, i.e., one-half the wave length The added layer is usually considered to be the phase shifter. Further details of various means for implementing of phase shifting are in "Phase Shifting and Other Challenges in Optical Mask Technology," 10th Bay Area Chrome Users Symposium, 1990, by Burn J. Lin, dated Sep. 26, 1990.

Thus, phase shifting is implemented so that the waves transmitted through two adjacent apertures in a photolithography mask are 180° out of phase with one another, whereby destructive interference minimizes the intensity between the images formed by the two apertures. Any optical system will project the images of such a phase shifting transmission object with better resolution and higher contrast than a corresponding transmission object without phase shifts. This improvement in resolution and contrast is highly advantageous in fine line optical lithography, as is typical of fabrication of very large scale integrated circuits.

One problem encountered with use of phase shift masks occurs when two adjacent regions of the mask which abut one another are of different phases. The presence of a transition region between two adjacent regions of an opposite-type phase is typically encountered for instance when a "T" junction is needed or at an "elbow" in which the two arms of the elbow are of different phase, or whenever two linear structures abut one another. For instance, as shown in top view in FIG. 1(a), a mask includes region A of phase 0° and region B of phase 180°, where regions A and B are intended to print on a wafer two adjacent structures which together define a single feature, such as a semiconductor region The areas 10, 12 on either side of regions A and B are the unexposed opaque portions of the mask which are covered with a material such as chrome. Note that FIG. 1(a) is a computer generated optical simulation for a projection lithography system using the Hopkins model of partial coherence called "SPLAT" (a well known system from the University of California, Berkeley) as are FIGS. 1(b) and the associated FIGS. 2 to 3. The printed line width of the feature in FIGS. 1 through 3 is 0.35 $\mu$m.

The mask shown in FIG. 1(a) (as is understood from optics) forms an intensity null in the image formed on the wafer at the junction between regions A and B as shown in FIG. 1(b). This undesirable intensity null 16 is shown in the inverted areal image intensity (dotted lines) in FIG. 1(b) where instead of the feature line defined by regions A and B being a straight clearly defined line there is instead bridging, i.e., unexposed portions (dotted line) 16 at the transition region. In a typical application this means that a semiconductor region defined by regions A and B might include a highly undesirable discontinuity.

A number of techniques have been proposed to solve this problem. One solution is use of the mask as shown in FIG. 2(a) which includes region A which is 0° phase, region B which is 180° phase, and also intermediate region C which is 90° phase.

It is to be understood that in the phase shifting mask context, typically a 0° phase means that there is no phase shifter layer present over that region. A 180° phase indicates that there is a full thickness of transparent material (phase shifter layer) over that region of the mask. For example the full thickness is about 3600 Å which is one-half of the wavelength divided by $(n-1)$, where n is the index of refraction of the phase shifter (here 1.5) for 365 nm light used to print the mask pattern onto a wafer. A 90° phase indicates that the thickness of the phase shifter layer over that portion of the mask is one-half of the full thickness, i.e., approximately 1800 Å in this example. It is to be understood that the various thicknesses of the phase shift layer are achieved by conventional masking and etching steps of the mask. The phase shifting layer material may be a resist such as PMMA or SOG (spun-on-glass). In another version, the actual mask substrate material (such as quartz) is conventionally masked, exposed by E-beam equipment, then etched to define subregions of various thicknesses, each thickness defining one phase.

The mask shown in FIG. 2(a) (in simulation) when used for integrated circuit fabrication prints the feature on the wafer as shown (also simulated) in FIG. 2(b). The image intensity is again shown by the white lines in FIG. 2(b). In FIG. 2(b) there are still significant intensity nulls 22, 24 at the two junctions defined between regions A and C and between C and B of FIG. 2(a). Again, this is undesirable because it is a degraded image and hence may produce a faulty semiconductor device (i.e., reduced fabrication yield).

Note however that there is a distinct improvement (in terms of the lessening of the intensity nulls) of FIG. 2(b) over that of FIG. 1(b). Thus it is clear that introducing one additional phase, i.e., having the three phases 0°, 90° and 180°, provides some improvement although this is probably insufficient for very small line width integrated circuits. It is to be appreciated that phase shifting is most useful for small line width integrated circuits, such as those having feature sizes well below 1 micrometer.

FIG. 2(c) is an exposure defocus diagram of the image shown in FIG. 2(b), showing the exposure defocus contours for a given critical dimension (such as the line width). The vertical axis of FIG. 2(c) is an arbitrary scale of exposure intensity; the horizontal axis shows defocus distance in $\mu$m. The shaded area is where lithography is acceptable, i.e., the critical dimension is maintained within +10% tolerance. The exposure contours are taken along horizontal lines (labelled a and b) through the line feature of FIG. 2(b). The exposure latitude as defined by the shaded areas is fairly narrow even at 0 $\mu$m defocus distance, and falls off sharply at higher defocus distances A known improvement over the FIG. 2(a) mask is to introduce an additional phase so as to have four phases forming a transition region. As shown in FIG. 3(a), here a mask includes region A having a 0° phase, region B having a 180° phase, region D having a 60° phase, and region E having a 120° phase. This provision of four phases provides a smoother transition between the 0° region A and the 180° phase region B in the resulting image and as shown in simulation in FIG. 3(b), will form a feature on the wafer with reduced intensity nulls 28, 30, 32, i.e., closer to a continuous line. However, simulation indicates that even the four phase FIG. 3(b) version exhibits to a certain extent the undesirable intensity nulls 28, 30, 32. FIG. 3(c) shows an exposure defocus diagram for the image of FIG. 3(b). Note that the gray area is significantly broader at both 0 $\mu$m and at higher defocus distances than was the correspondence diagram of FIG. 2(c), but still is quite narrow at the higher defocus distances. Here, the exposure contours are taken along four arbitrarily located horizontal lines (a, b, c, d) of the image of FIG. 3(b).

This suggests that five or more phases are needed for excellent resolution at for instance 0.35 $\mu$m feature sizes. FIG. 4 shows an exposure defocus diagram for 15 phases (the corresponding mask and image simulations are not shown). While 15 phases provides a broad exposure latitude at 0 $\mu$m defocus distance, the latitude (gray area) still narrows significantly at 2 $\mu$m defocus distance. Thus even a very large number of phases still results in a less than optimum image using the prior art technique.

However, the solution to this problem as provided by the four phase mask of FIG. 3(a) (or a mask with for instance five phases) has the significant disadvantage that such multiple phase regions substantially increase the cost and complexity of mask making. This is because exposing additional phase shifter layers using the usual electron beam mask lithography system complicates mask production, because transfer of the desired pattern to the phase shift medium in the mask increases mask fabrication complexity and time. The increase in complexity requiring extra process steps significantly reduces yield of the masks and hence increases cost.

The mask shown in top view in FIG. 3(a) is shown in a cross-sectional side view in FIG. 5 with the mask formed on a quartz substrate 40. Three thicknesses of phase shifters B, E, D are formed on the substrate. The greatest thickness is in region B which is the 180° phase shift. Regions D and E are comparatively thinner, proportional to the amount of the phase shift. In region A where there is 0° phase shift, no phase shifter material is present. Thus the transition region is a step-type ramp as seen in cross-section. As discussed above, this structure while it approaches the goal of a properly printing transition region, has the significant disadvantage of being relatively difficult and complex to form on the mask and also requires additional processing steps to form up to five phases.

Also relating to phase shifting, U.S. Pat. No. 4,902,899 issued Feb. 20, 1990 to Burn J. Lin et al. is directed to a lithographic process having improved image quality that employs a mask including a plurality of opaque elements or transparent elements smaller than the resolution of the lithography. At column 5, beginning at line 11 Lin et al. disclose use of pixels in a phase shifting mask where different pixels define regions of varying thicknesses, for phase shifting masks. However this document does not disclose any implementation of the described method. Also, this document is not directed to the problem of the junction between two abutting regions of different phase, i.e., the undesirable existence therein of intensity nulls.

SUMMARY OF THE INVENTION

In accordance with the invention, a phase shift mask for lithography includes a transition region between two regions of opposite phase, where the transition region simulates the effect of a ramp in the phase shifter material by using small subregions each of which is one of three phases, in one embodiment. This advantageously provides a transition region having only three phases, which has the advantages in terms of resolution and depth of focus of a prior art transition region using four or more phases. The three phases are assigned to pixels (subregions of arbitrary size and shape) in the transition region, whereby the phase assignment of each pixel is assigned by an algorithm which takes into account optical resolution and depth of focus of the fabrication process.

The minimum number of phases required is three, if two of the phases are 0° and 180°, since these two phases would merely reverse the sign of the electric field. An additional degree of freedom is gained by using a phase with a non-zero complex (orthogonal) component such as a 90° phase. Then summation of electric field contributions from the pixels with various phase arrangements lead to a result with a different overall phase at the image (i.e., printed on the resist layer on the wafer). The assignment algorithm determines the assignments of the phases to individual pixels and provides various pixel arrangements to simulate the effects of phases other than the actual pixel phase assignments. Thus a continuous transition, i.e., a ramp, is emulated by suitable assignment of phases. The pixel size (diameter) is approximately 1/5th the wave length of the intended incident light divided by the numerical aperture of the lithography system (but may be of smaller size).

This method minimizes critical dimension variation in the exposure dose, comparable to the critical dimension variation achievable with phase shift techniques in non-transition regions. The transition region is as high quality using three phases, i.e., has as few intensity nulls, as is a transition region generated using the conventional technology using four phases or more.

In one embodiment, a transition region between the 0° phase region and the 180° phase region includes a number of rows of pixels, each row having a particular combination of pixels of various phases so as to smoothly transition from the 0° phase to the 180° phase.

In another embodiment, the transition region of the mask between two regions of opposite phase includes an arbitrary number (such as approximately five) intermediate regions in the phase shifting material. Each intermediate region includes several subregions where each subregion (a pixel in one embodiment) is of a particular phase and the subregions in each intermediate region are selected so as to provide a gradual transition from the phases which are to be joined by the transition region. Thus for instance the first intermediate region adjacent the 0° region is chiefly of subregions of 0° phase with some subregions of 90° phase. The next adjacent intermediate region is approximately half 0° phase subregions and half 90° phase subregions. The next intermediate region is all 90° phase. The next intermediate region is half 90° and half 180° phase subregions. The next intermediate region is mostly 180° phase subregions with some 90° phase subregions. The final intermediate region is all 180° phase subregions. The subregions may be pixels as exposed by the mask making imaging system.

Thus with both embodiments, a transition is created from the 0° phase region to the 180° phase region such that intensity variation in the optical image corresponding to the intermediate transition region is minimized, and/or sensitivity to the edge contrast of the optical image is minimized, and/or resolution is improved, and/or focus sensitivity is minimized in the transition region. The synthesized transition region pattern, i.e., the selection of the various pixels, achieves this result using a combination of a pattern manipulation algorithm and optimization techniques.

In other embodiments, the number of phases n used may be four or more; in each case, the depth of focus (defocus distance) and exposure latitude (intensity variation) are superior to that provided by prior art phase shift masks having the same number n of phases.

BRIEF DESCRIPTION OF THE DRAWINGS

FIGS. 1(a), 1(b), 2(a), 2(b), 2(c), 3(a), 3(b), 3(c), 4, and 5 show prior art phase shifting masks and the resulting wafer images.

DETAILED DESCRIPTION OF THE INVENTION

Figure 1B:
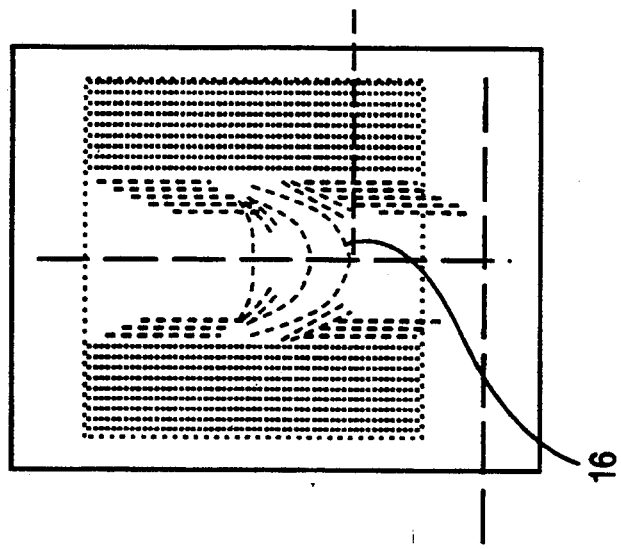
Figure 1A:
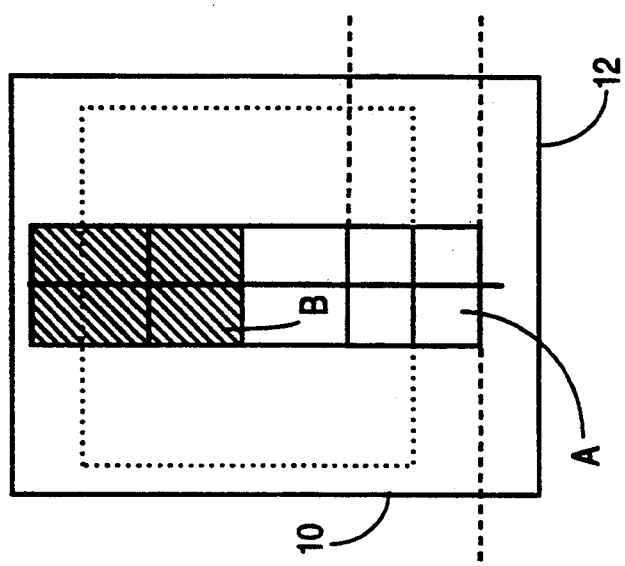
Figure 2B:
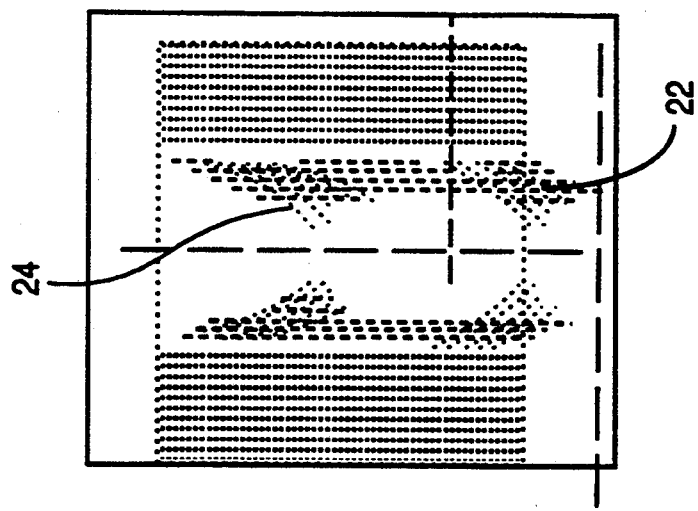
Figure 2A:
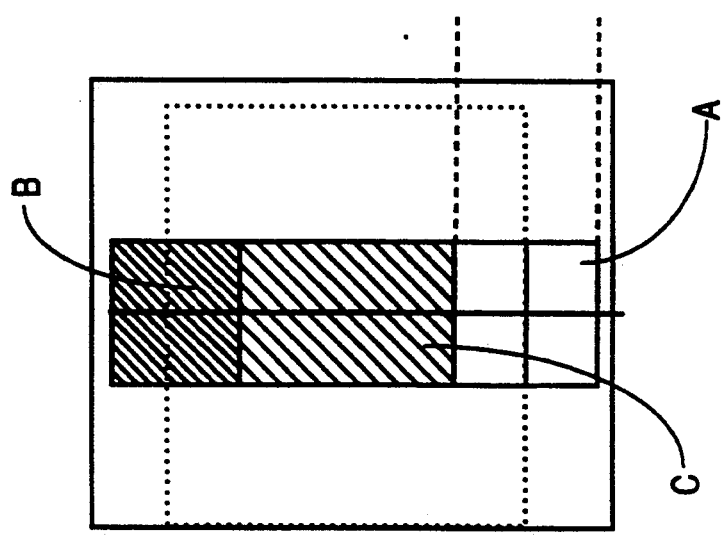
Figure 2C:
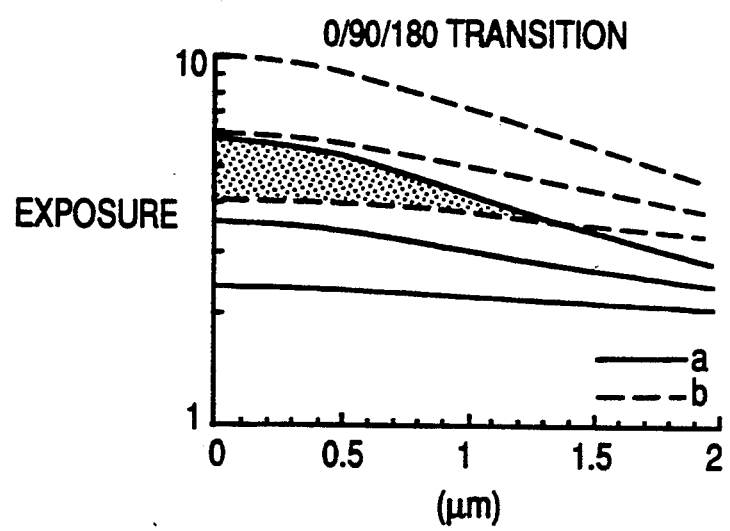
Figure 6A:
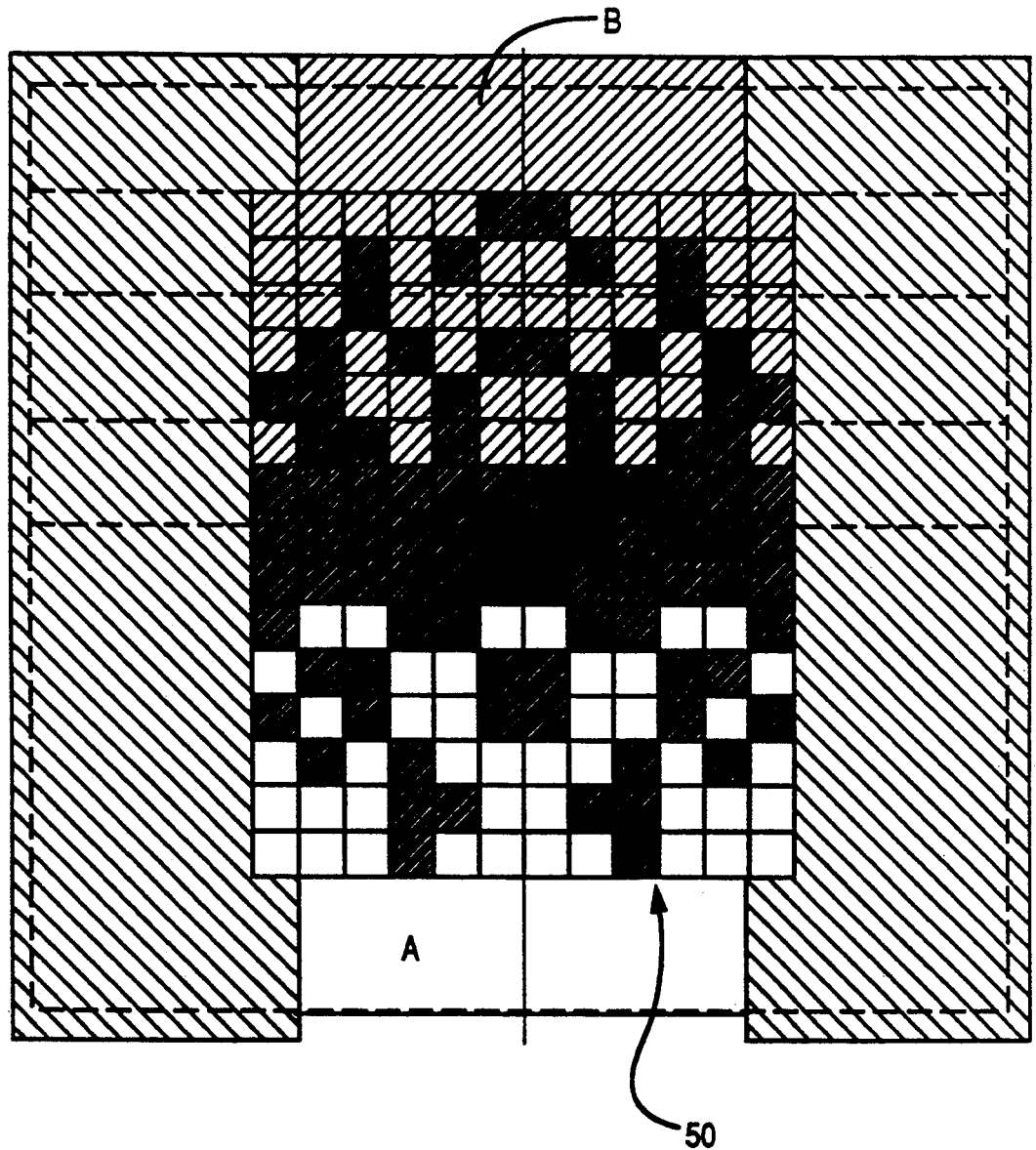
FIGS. 6(a), 6(b), 7(a), and 7(b) show phase shifting masks in accordance with the invention and the resulting wafer images.

FIG. 6(a) shows in simulation a top view of a portion of a phase shifting mask in accordance with the invention. The structure of FIG. 6(a) corresponds to that of FIG. 2(a); however, in FIG. 6(a), instead of there being three distinct phase regions, i.e., 0°, 90°, and 180°, the transition region 50 is a mosaic of rows and columns of pixels of three phases: 0° (the all white pixels), 90° (the darker pixels), and 180° (the shaded pixels). The transition region joins two end regions A, B which are respectively of 0° and 180° phase. Those portions (rows of pixels) of the transition region 50 nearest the 0° phase region A are chiefly 0° phase pixels. Some of the pixels in these rows are of 90° phase. At the center of the transition region 50, in three of the rows all of the pixels are of 90° phase. Progressing from the 0° phase region A to the center of the transition region, an approximately linearly increasing proportion of pixels in each row are of 90° phase. Then moving upwards in the drawing towards the 180° phase region B, the transition region 50 is a combination in each row of 90° phase pixels and 180° phase pixels, with the proportion of the 180° phase pixels in each row approximately linearly increasing moving upwards towards the 180° phase region B. The rows of the transition region immediately adjacent to the 180° phase region B are mostly 180° phase pixels.

The transition region 50 is 12 pixels wide, i.e., each row of pixels has 12 pixels, defining 12 columns. Each pixel conventionally is defined by four circular electron beam spots arranged quadrilaterally to define a square.

As shown, the transition region 50 between the 0° and 180° phase regions A, B is wider by two pixels (20% of the width of region 50) than are the 0° and 180° phase regions A, B. This extra width minimizes deviation of the image from the nominal mask pattern.

To further define the algorithm by which the pixels are assigned a particular phase, in FIG. 6(a), the bottom-most row of pixels in the transition region 50 has 12 pixels, of which 10 are 0° phase and 2 are 90° phase. The next two rows (moving upwards) each have 8 pixels of 0° phase and 4 pixels of 90° phase. The next three rows moving upwards each have 6 pixels of 0° phase and 6 pixels of 90° phase. The next three rows (center of region 50) are all 90° phase pixels. The pixels in the upper portion of region 50 are approximately a mirror image (about the horizontal axis of region 50) of those in the lower portion in terms of the numbers of pixels of each phase in each row, except that 180° phase pixels are substituted for the 0° phase pixels used in the lower portion of region 50. In each row of region 50 the arrangement (order) of pixels is random but symmetric about the vertical axis of region 50.

The length of the transition region 50 (the distance from region A to region B) is in the range of 0.6 * λ/na to 2.0 * λ/na.

It is to be understood that as described above, in the context of mask making "phase" refers only to the local thickness of the phase shifting layer, with 0° phase meaning no phase shifting layer, 180° meaning a phase shifting layer having a thickness of one-half the wavelength of the imaging light used for printing, and 90° referring to a thickness of one quarter of the wavelength of the imaging light.

Figure 3C:
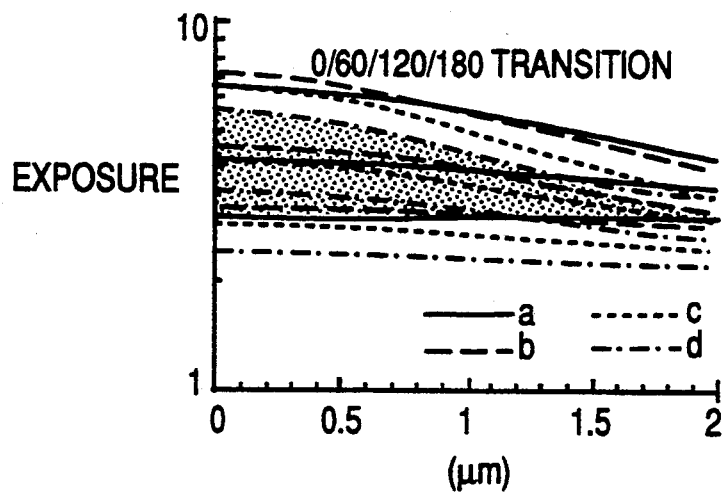
Figure 4:
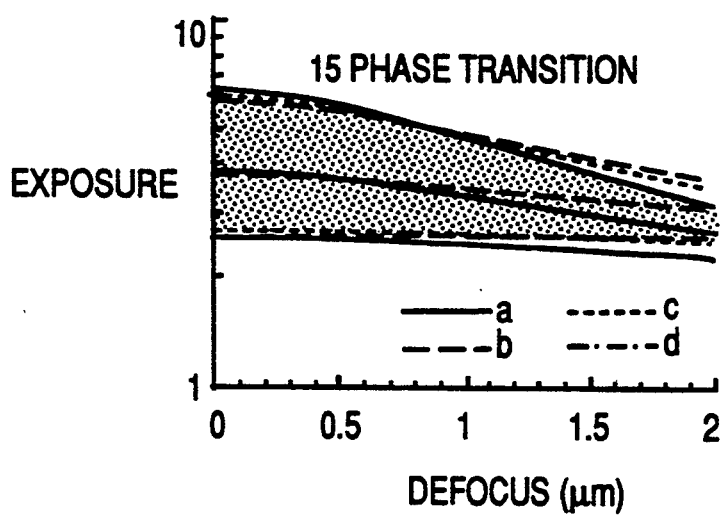
Figure 5:
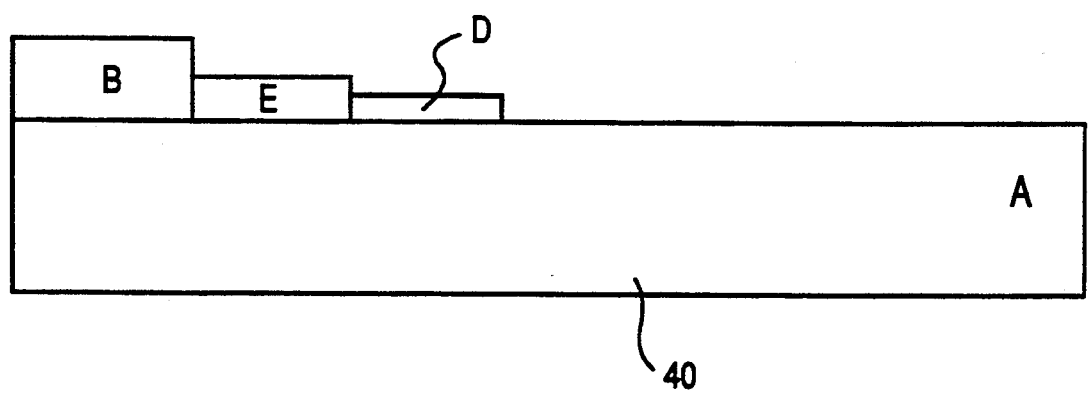
Figure 6B:
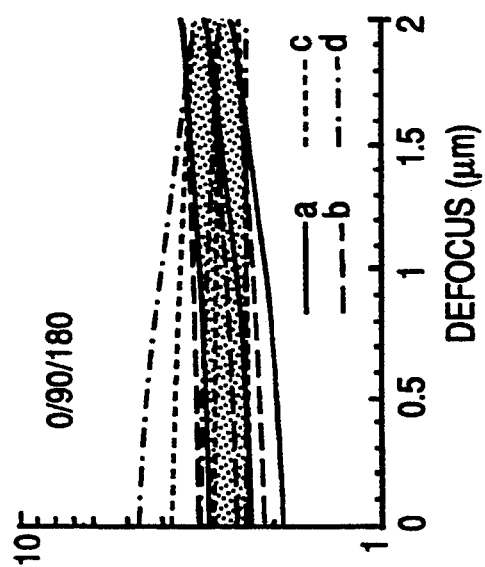

The mask shown in simulation FIG. 6(a) when used to fabricate (image) a feature on a wafer provides a feature having the exposure characteristics shown (in simulation) in the exposure defocus diagram of FIG. 6(b). The imaged feature (not shown) exhibits only minimal intensity nulls, and advantageously as shown in FIG. 6(b) has a relatively broad exposure latitude (shaded area) even at large defocus distances. Thus the resolution provided by the mask of FIG. 6(a) is comparable to that provided by the prior art mask of FIG. 3(a). Advantageously, however, this is accomplished by use of only three phases rather than four phases as in the prior art of FIG. 3(a).

Figure 7B:
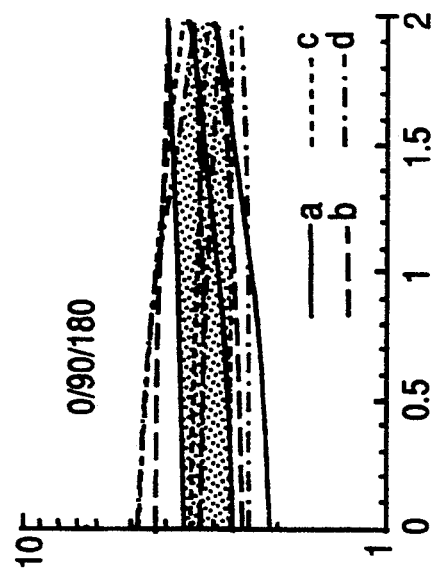
Figure 7A:
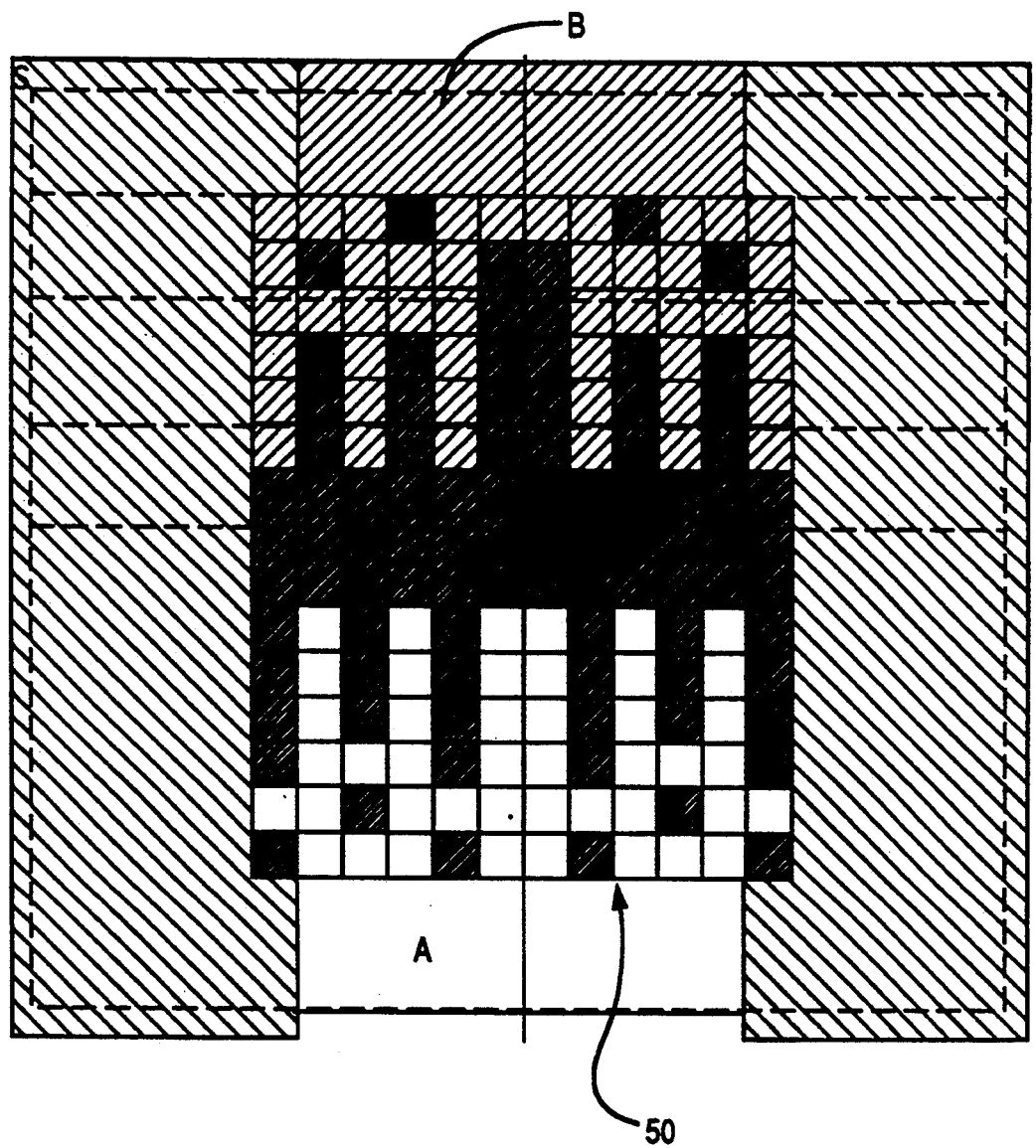

FIG. 7(a) shows another mask similar to that of FIG. 6(a); the difference is that in FIG. 7(a), the pixels are organized so that pixels of like phase are arranged to the extent possible in columns. FIG. 7(b) shows that the mask of FIG. 7(a) yields similar exposure defocus lithography results (i.e., as good an image) as does the mask of FIG. 6(a). Thus the arrangement of pixels on each row of the transition region 50 on a microscopic basis does not affect the quality of the resulting image. Desirably, however, again in FIG. 7(a) each pixel row is symmetric about the vertical axis of region 50 in terms of pixel phase assignments.

Figure 8:
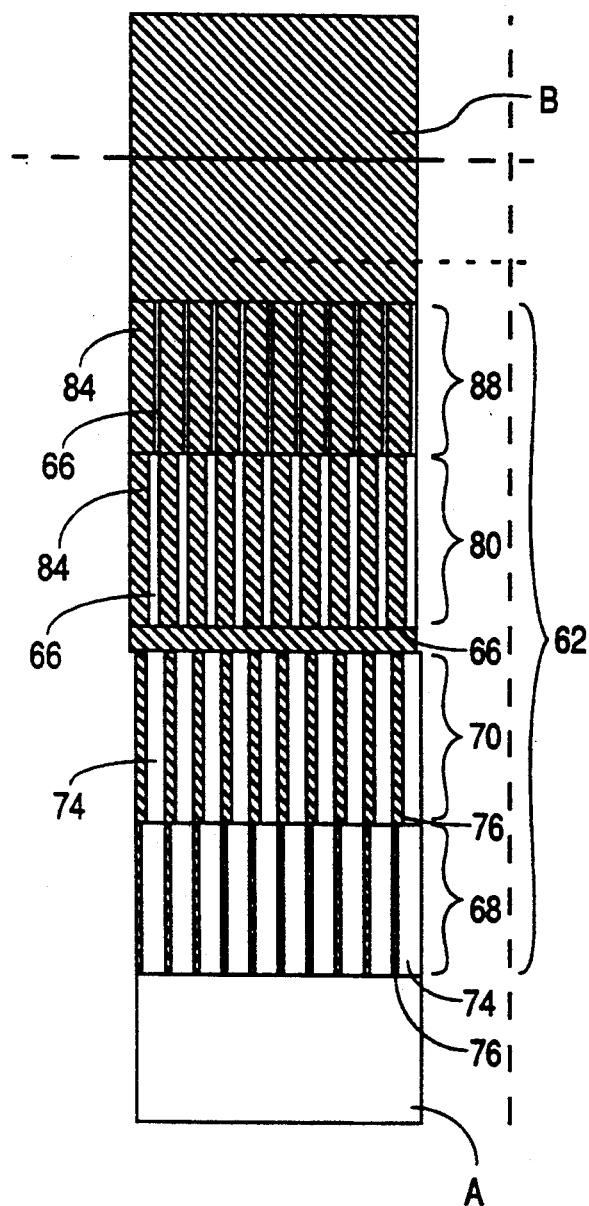
FIG. 8 shows another phase shifting mask in accordance with the invention.

FIG. 8 shows another embodiment of a mask in accordance with the invention. The transition region 62 connects the 0° phase region A with the 180° phase region B. Near the center of transition region 62 is a relatively narrow region 66 of 90° phase. Intermediate between the 90° phase region 66 and the 0° phase region A are two regions 68, 70 the lower one 68 of which is a combination of 0° phase subregions 74 (also referred to as pixels) and 90° phase subregions 76. The next intermediate region 70 moving upwards in the figure is also such a combination but with the 90° phase subregions 76 being a larger proportion of the area of region 70. Immediately above the all 90° phase region 66 is another intermediate region 80 which is chiefly 90° phase subregions 66 with some 180° phase subregions 84. The next intermediate region 88 moving upwards in the figure is chiefly 180° phase subregions 84. With some 90° phase subregions 66. The next region is the all 180° phase region B.

In FIG. 8 the subregions (pixels) 66, 74, etc. are elongated rectangles. The mask of FIG. 8 differs from that of FIG. 6(a) in that in FIG. 8, (1) the pixels are elongated rectangles (not squares); (2) there are (arbitrarily) only 6 rows 68, 70, 66, 80, 88 of pixels; (3) in each row of pixels (except for region 66), the two types of pixels alternate, rather than the more random arrangement as in FIG. 6(a); and (4) in FIG. 8, the size of the pixels (length and width) differs from row to row.

Simulation results indicate that the actual microscopic pixel arrangement (in terms of rows or columns) in accordance with the invention is not critical in terms of the performance of the feature printed using such a mask. In other words, it is the macroscopic qualities of the pixel arrangements as described above which is both novel over the prior art and also provides the desired advantage.

The width of each subregion in FIG. 8 is about 0.2*λ/na, where λ is the wavelength of the light used to print the wafer from the mask, and na is the numerical aperture of the printing imaging system. The pixel rectangles of FIG. 8 and squares of FIG. 6(a) and 7(a) are arbitrary shapes; the subregions (pixels) may be any geometric figure capable of close packing, i.e., hexagons, squares, rectangles, etc.

Fabrication and use for imaging wafers of the masks of FIGS. 6(a), 7(a) and 8 is as follows. Beginning with a conventional quartz mask substrate, a layer of chrome is conventionally applied to a principal surface thereof. The chrome layer is then conventionally masked and etched to define the non-opaque portions (apertures) of the mask. Then a resist layer of conventional E-beam (electron beam) resist such as PBS is applied to the exposed (non-chromed) portions of the substrate. This may be a negative or positive resist. Then using conventional E-beam mask writing equipment, the E-beam scans the surface of the resist in a first pass, writing (exposing) the mask pattern conventionally, and particularly exposing at a particular dose those pixels in the transition regions which are the 0° phase pixels. The other pixels in the transition regions are not exposed on this first pass.

Then a second exposing pass is made on the mask, exposing at a different dose (typically one half the first pass dose) the 90° phase pixels in the transition region. It is to be understood that these two passes are also used for purposes of writing other features on the mask.

Then the exposed resist is conventionally developed and the underlying substrate is conventionally etched, forming areas of localized thickness in the phase shifter layer on the substrate surface corresponding to the degree of exposure. Note that the 180° phase pixels need not be exposed since they represent the maximum thickness of phase shifter material.

Alternatively, the pixels of all phases may be written in one pass by changing dosage between pixels.

Alternatively, the step of developing and etching may immediately follow each of the two exposing steps.

After the substrate is etched and all remaining resist is stripped, other processing of the mask is conventional.

The mask is then used conventionally to photolithographically form patterns (print features) on wafers. The actual use of the phase shifting mask is wholly conventional and compatible with existing wafer fabrication processes, except that resolution (or other corresponding optical factors such as depth of focus) is improved.

It is to be understood that the above description is illustrative and not limiting. For instance, one may use four phases (or more) rather than three phases. In the case where four phases are used, these phases might be 0°, 60°, 120°, and 180°. Thus a first row of the transition region would be all 0° phase pixels adjacent the 0° phase end region, and pixel assignments would transition over several pixel rows to an all 60° phase pixel row. The next portion of the transition region would then transition in terms of pixel assignments over several rows to an all 120° phase pixel row, and the final portion transition over several rows to an all 180° phase pixel row adjacent the 180° phase end region.

The above description of the use of three phases emphasizes the advantage of the invention in using three phases over the prior art use of four phases to achieve similar results. In another embodiment, additional rows of pixels (i.e., smaller size pixels) would improve the image resolution. Also, the invention is applicable to masks for use in lithography at all optical wavelengths, and also ultra violet, infra red, and other wavelengths.

I claim:

1. A phase shift mask for lithography for defining transition region between a first and a second region of respectively two different first and second phases, the mask also defining at least a third phase, and the transition region comprising:

at least one intermediate portion being composed of the third phase;

a first portion between the first region and the intermediate portion being composed of a plurality of subregions of the first phase and subregions of the third phase, the density of the first phase in the first portion increasing from the intermediate portion toward the first region; and a second portion between the second region and the intermediate portion being composed of a plurality of subregions of the second phase and subregions of the third phase, the density of the second phase in the second portion increasing from the middle portion toward the second portion.

2. The mask of claim 1 wherein each subregion is rectangular.

3. The mask of claim 1 wherein the third phase includes a complex optical component relative to the first two phases.

4. The mask of claim 1 wherein each subregion is formed of at least one pixel.

5. The mask of claim 1 wherein the width of each subregion is equal to approximately 1/5th of the wave length of incident light for the photolithography divided by the numeric aperture of an imaging system used for the lithography.

6. The mask of claim 1 wherein the subregions are of close packing shape.

7. The mask of claim 1 wherein the first phase is defined by the presence of a phase shifter layer and the second phase is defined by the absence of a phase shifter layer on a substrate of the mask.

8. The mask of claim 4, wherein the pixels are arranged in rows and columns, the columns being arranged along an axis defined by a length of the transition region, and the pixels in each row are arranged in terms of phase assignment symmetrically about a centerline of the transition region.

9. The mask of claim 8, wherein the phase assignment of pixels in each row is an approximately linear function of a distance of the row from either the first region or the second region.

10. The mask of claim 1, wherein the transition region differs in width by about 20% from the width of the first region.

11. A method of lithographically forming features on a substrate using the mask of claim 1 and comprising the steps of:
providing the mask of claim 1;
lithographically defining features on the substrate by passing radiation through the mask onto a substrate having a sensitive layer on its surface; and
forming the defined features in the substrate.

12. A method of lithographically forming features on a substrate using a mask and comprising the steps of:
providing the mask for defining at least one transition regions between two regions of differing phase, said transition region comprising pixels of at least one third phase, and pixels of the two differing phases to simulate a ramp between the two regions;
lithographically defining features on a sensitive layer formed on a surface of the substrate by passing radiation through the mask onto the layer; and
etching the defines features into the surface.

13. A method as in claim 12, wherein said transition region comprises at least one intermediate portion being composed of a third phase;
a first portion between the region of one differing phase and the intermediate portion being composed of a plurality of subregions of the pixels of the one differing phase and subregions of the pixels of the third phase, the density of the one differing phase in the first portion increasing from the intermediate portion toward the region of the one differing phase; and a second portion between the region of the other differing phase and the intermediate portion being composed of a plurality of subregions of the pixels of the other differing phase and subregions of the pixels of the third phase, the density of the other differing phase in the second portion increasing from the intermediate portion toward the region of the other differing phase.

14. A method of making a phase shift mask comprising the step of:
providing a substrate;
forming a resist layer on the substrate;
exposing the resist layer for defining a first and second region of opposite first and second phases and for defining a plurality of pixels on the resist layer defining a transition region between the first and second regions, said pixels comprising pixels of at least one third phase and pixels of the first phase and second phase, the transition region including at least one intermediate portion being composed of the pixels of the third phase, a first portion between the first region and the intermediate portion being composed of the pixels of the first and third phases, the density of the pixels of the first phase in the first portion increasing from the intermediate portion toward the first region, and a second portion between the second region and the intermediate portion being composed of the pixels of the second and third phases, the density of the pixels of the second phase in the second portion increasing from the intermediate portion toward the second region; and
developing the resist layer.

* * * * *